US012806655B2

(12) United States Patent
Chwalek et al.

(10) Patent No.: US 12,806,655 B2
(45) Date of Patent: Nov. 24, 2026

(54) HIGH BANDWIDTH ULTRASONIC TRANSDUCER WITH METAL BACKING LAYER AND METHOD OF FABRICATION

(71) Applicant: Ascent Ventures, LLC, Pittsford, NY (US)

(72) Inventors: James M Chwalek, Pittsford, NY (US); Todd A Jackson, Walworth, NY (US)

(73) Assignee: BYK GARDNER GMBH, Wesel (DE)

( * ) Notice: Subject to any disclaimer, the term of this patent is extended or adjusted under 35 U.S.C. 154(b) by 1171 days.

(21) Appl. No.: 17/196,840

(22) Filed: Mar. 9, 2021

(65) Prior Publication Data

US 2021/0283656 A1 Sep. 16, 2021

Related U.S. Application Data

(60) Provisional application No. 62/988,742, filed on Mar. 12, 2020.

(51) Int. Cl.

| | |
|---|---|
| ***B06B 1/06*** | (2006.01) |
| ***H01L 41/312*** | (2013.01) |
| ***H10N 30/072*** | (2023.01) |
| *H10N 30/853* | (2023.01) |

(52) U.S. Cl.

CPC ......... *B06B 1/0685* (2013.01); *H10N 30/072* (2023.02); *H10N 30/853* (2023.02); *H10N 30/8536* (2023.02); *H10N 30/8542* (2023.02); *H10N 30/8554* (2023.02)

(58) Field of Classification Search

CPC .. B06B 1/0685; H10N 30/072; H10N 30/853; H10N 30/8536; H10N 30/8542; H10N 30/8554

USPC ........................................................ 310/327

See application file for complete search history.

(56) References Cited

U.S. PATENT DOCUMENTS

| | | | | |
|---|---|---|---|---|
| 2,972,068 | A | 2/1961 | Howry et al. | |
| 4,296,349 | A | 10/1981 | Nakanishi et al. | |
| 4,420,707 | A | 12/1983 | VanValkenburg | |
| 5,078,013 | A | 1/1992 | Kuramochi et al. | |
| 5,777,230 | A | 7/1998 | Vandervalk | |
| 2004/0108021 | A1 * | 6/2004 | Evans ................... | B41N 1/083 148/552 |

(Continued)

FOREIGN PATENT DOCUMENTS

| | | | |
|---|---|---|---|
| DE | 69129774 | T2 | 8/1998 |
| DE | 102019218336 | A1 | 6/2020 |

*Primary Examiner* — Emily P Pham
*Assistant Examiner* — Monica Mata
(74) *Attorney, Agent, or Firm* — Brown & Michaels, PC

(57) ABSTRACT

An ultrasonic transducer includes a delay line substrate, a piezoelectric element, a metal conductive layer between the delay line substrate and the piezoelectric element, and a backing layer applied to the piezoelectric element. The delay line substrate and the piezoelectric element are acoustically joined, configured to couple ultrasonic waves from the piezoelectric element into the delay line substrate or from the delay line substrate into the piezoelectric element. The backing layer includes a metal film, the metal film has a thickness and an acoustic impedance, and the thickness and the acoustic impedance each have value sufficient to provide acoustic damping. The backing layer has a substantially columnar cross-sectional morphology with a substantially granular surface morphology.

15 Claims, 8 Drawing Sheets

(56) References Cited

U.S. PATENT DOCUMENTS

| | | | | |
|---|---|---|---|---|
| 2011/0178407 | A1* | 7/2011 | Lu | G01S 15/8952 600/459 |
| 2014/0355381 | A1* | 12/2014 | Lal | H01J 49/025 327/356 |

* cited by examiner

HIGH BANDWIDTH ULTRASONIC TRANSDUCER WITH METAL BACKING LAYER AND METHOD OF FABRICATION

CROSS-REFERENCE TO RELATED APPLICATIONS

The present application claims priority to U.S. Provisional Patent Application 62/988,742 filed Mar. 12, 2020, titled “High Bandwidth Ultrasonic Transducer with Metal Backing Layer and Method of Fabrication”.

BACKGROUND OF THE INVENTION

The invention pertains to the field of ultrasonic transducers, and more particularly, to metal backing layers for high frequency transducers and methods of fabrication.

Ultrasonic testing of materials utilizes an ultrasonic transducer to introduce an ultrasonic stimulus wave into a test material, and to detect transmitted or reflected ultrasonic waves for analysis. The ultrasonic stimulus waves can be either compressive or shear waves. It is common for two ultrasonic transducers to be used where a first transducer introduces the stimulus waves and a second transducer detects reflected or transmitted waves. It is also common for a single transducer to be used to both introduce the stimulus waves and to detect reflected waves. It is also common for such transducers to employ an ultrasonic delay line in order to introduce a pre-determined time delay between the stimulus waves and the reflected waves. Most often the stimulus waves are high energy waves whereas the reflected waves are much attenuated in comparison to the stimulus waves due to a number of energy loss mechanisms such as partial reflections from multiple surfaces, scattering, and absorption. The need to accurately measure the reflected waves motivates use of a very sensitive receiver with a high signal-to-noise ratio. As such, the stimulus signal can easily saturate the sensitive receiver electronics, and this saturation is addressed with a time delay between the stimulus waves and the reflected waves to allow sufficient recovery of the receiver electronics. U.S. Pat. No. 5,777,230 entitled “DELAY LINE FOR AN ULTRASONIC PROBE AND METHOD OF USING SAME” and issued Jul. 7, 1998 to Vandervalk, discloses an ultrasonic transducer with a delay line acoustically coupled to the transducer so that ultrasonic vibrations may be transmitted into the delay line from the transducer in a first direction. The delay line includes a first section and a second section, which form an interface substantially perpendicular to the first direction. The second section includes a surface for coupling with a material to be investigated.

FIG. 1 is a cross section of a representative delay line transducer 8. The delay line 10 is acoustically coupled to an ultrasonic stimulus wave generator such as a piezoelectric element 12. The delay line 10 is typically fabricated using a sufficient thickness of a solid material (based on a sound velocity of the solid material) such as various glasses or plastics. For low frequency transducers, the piezoelectric element 12 can be pressed against the delay line 10 to couple the delay line 10 and the piezoelectric element 12. To enhance this coupling and mitigate any surface non-uniformity between the delay line 10 and the piezoelectric element 12, a fluid such as water or glycerin (not shown) can be used as an intermediary. As the frequency increases, and the wavelengths decrease, the coupling between the delay line 10 and the piezoelectric element 12 is insufficient to attain high-performance coupling. Often, in this case, a thin adhesive 14 is used to bond the piezoelectric element 12 to the delay line 10. First conductive electrode 16 and second conductive electrode 18 facilitate application of a stimulus voltage to excite the piezoelectric material 12. Electrical contact to these conductive electrodes 16, 18 is made through a wire 20 to the second conductive electrode and an electrical path (not shown) from the first conductive electrode 16 to an electrically conductive housing 24. The electrical path, for example, may be through a ring of electrically conductive epoxy 22. An external electrical connection is made through an appropriate connector 26 mounted on the housing 24.

It is common to consider the operation of the vibrating piezoelectric material 12 as launching traveling acoustic waves in both the forward direction, i.e., toward the delay line 10 as well as in the backward direction, i.e., towards the backing layer 28. The backing layer 28 is employed to provide both dampening of the vibrating piezoelectric material 12 as well as to scatter and absorb the backward traveling wave. The backing layer 28, properly configured, can facilitate a short temporal response and a high bandwidth, resulting in a high-resolution transducer 8. Such transducers are particularly useful in non-destructive testing and layer thickness metrology. The high acoustic impedance of many high-performance piezoelectric materials motivates the use of a high acoustic impedance backing layer, if a short temporal response is desired. Typically, the backing layer includes an epoxy impregnated with small dense particles of metal, such as silver or tungsten. Backing layer particles that are small compared to the wavelength of the acoustic waves generated in the transducer 8 facilitate a high acoustic impedance, and hence, a high degree of damping while scattering, diffusing, and absorbing the backward traveling acoustic wave that is coupled into the material of the backing layer 28.

U.S. Pat. No. 2,972,068 titled “UNI-DIRECTIONAL ULTRASONIC TRANSDUCER” and issued Feb. 14, 1961 to Howry, et. al. discloses a highly effective acoustic impedance matching element for piezoelectric crystals that may be constructed from a synthetic resin having therein a high concentration of a fine powder of a heavy metal. Contrary to current teaching, this synthetic resin may be made to act as an efficient absorber of ultrasonic wave energy, the attenuation increasing with increased density of the metal in the resin. U.S. Pat. No. 5,078,013 titled “ULTRASONIC MEASURING APPARATUS USING A HIGH-DAMPING PROBE” and issued Jan. 7, 1992 to Kuramochi, et. al. discloses a high-damping probe capable of obtaining not only sound velocity information but also other ultrasonic information useful for ultrasonic testing. In this reference, a low-frequency damper is described in order to absorb unnecessary low-frequency vibrations of the transducer. The low-frequency damper may be formed using a suitable resin material. Kuramochi et al. disclose that it is preferable to use tungsten powder, which is compacted with a resin material under a predetermined pressure. Although a resin material alone is capable of damping the vibration of the transducer, the damping effect is improved by mixing it with tungsten powder. It has been confirmed that such a mixed material is particularly effective to damp the low-frequency component of ultrasonic waves.

While epoxy laden with metal particles may work as a damping material, the production of this epoxy with a uniform and consistent high acoustic impedance is difficult. Getting to the high metal loading required for very high impedances and hence bandwidths tends to make the epoxy difficult to mix. The heavy, metal particles settle, interfering with uniformity. Air often becomes embedded in the mixture resulting in non-uniform air pockets of low acoustic impedance. The higher the desired frequency of the transducer the smaller the particle size needed, exacerbating the aforementioned difficulties. In addition, the value of acoustic impedance achieved by the epoxy is often very sensitive to the metal particle concentration in the mixture resulting in variation from batch to batch.

Other related alternatives for backing layers have been disclosed. U.S. Pat. No. 4,420,707 entitled "BACKING FOR ULTRASONIC TRANSDUCER CRYSTAL" and issued Dec. 13, 1983 to VanValkenberg discloses a disk of porous sintered metal employed as the backing material for a piezoelectric crystal in an ultrasonic transducer. However, as the frequency increases, the required pore size reduces, making fabrication difficult and costly. Further, sufficient acoustic coupling of this backing material to the piezoelectric material becomes difficult as the frequency increases. Furthermore, the application of either metal particle-containing epoxy or porous, sintered metal requires fabrication to be done on a device-by-device level. Such fabrication, while providing functional devices, is sub-optimal from the standpoint of consistency and cost.

The deposition of thin film metals through standard wafer-level semiconductor processes such as thermal or e-beam evaporation, DC or RF sputtering, have the ability to produce high acoustic impedance layers amenable to wafer-level processing. U.S. Pat. No. 4,296,349 titled "ULTRASONIC TRANSDUCER" and issued Oct. 20, 1981 to Nakanishi, et. al. discloses an ultrasonic transducer usable for diagnostic purposes. This ultrasonic transducer includes a piezoelectric element such as a PVDF polymer film backed with a reflective layer of a reduced thickness specified in relation to the wavelength of sound waves within the reflective layer. The thickness of the reflective layer is in a range from $\frac{1}{32}\lambda$ to $\frac{3}{16}\lambda$, wherein $\lambda$ refers to the wavelength of sound waves within the reflective layer at one half of the free resonant frequency of the piezoelectric element. This specified thickness of the reflective layer increases the backward acoustic impedance, thereby minimizing leakage of ultrasonic waves via the holder substrate. In this case, however, the metal layer, while providing a high acoustic impedance, is only provided as a matching layer to aid in the transfer of energy of the backward traveling acoustic waves from the piezoelectric element to the holder substrate. As such, the metal layer ideally requires a low acoustic energy loss and therefore does not significantly scatter, diffuse, or absorb the backward traveling acoustic wave. The holder substrate, fabricated separately, to which the metal film is attached, is burdened to sufficiently diminish the backward traveling wave. Such device configurations and fabrication are not suitable to low cost, consistent performance, wafer-level production.

SUMMARY OF THE INVENTION

The present invention includes a wafer-level method of fabricating a backing layer that provides a high level of damping through a high acoustic impedance, has a high acoustic energy loss, and hence scatters, diffuses, and/or absorbs the backward traveling acoustic waves. According to the wafer-level method of fabricating, the backing layer can be manufactured with consistent device-to-device performance at a low manufacturing cost.

In an embodiment, an ultrasonic transducer includes a delay line substrate, a piezoelectric element, a metal conductive layer between the delay line substrate and the piezoelectric element, and a backing layer applied to the piezoelectric element. The delay line substrate and the piezoelectric element are acoustically joined, configured to couple ultrasonic waves from the piezoelectric element into the delay line substrate or from the delay line substrate into the piezoelectric element. The backing layer includes a metal film, the metal film has a thickness and an acoustic impedance, and the thickness and the acoustic impedance each have value sufficient to provide acoustic damping. The backing layer has a substantially columnar cross-sectional morphology with a substantially granular surface morphology.

In another embodiment, a method of producing an ultrasonic transducer includes providing a delay line substrate, providing a piezoelectric substrate as an active transducer element, depositing a first metal layer on the delay line substrate, depositing a second metal layer on the piezoelectric substrate, bonding the first metal layer to the second metal layer to facilitate coupling ultrasonic waves from the piezoelectric element into the delay line or from the delay line into the piezoelectric element, milling the piezoelectric substrate to expose a portion of at least one of the first metal layer and the second metal layer, depositing a first patterned electrode on the portion to allow external electrical connection to the at least one of the first metal layer and the second metal layer, and depositing a second patterned electrode on the piezoelectric element, the second patterned electrode defining an active area of the ultrasonic transducer and acting as a backing layer. The second patterned electrode is configured to electrically connect externally. The second patterned electrode includes a metal film, the metal film having an acoustic impedance and a thickness, the acoustic impedance and the thickness being of sufficient value to provide acoustic damping. The metal film has a substantially columnar cross sectional morphology with a substantially granular surface morphology.

DETAILED DESCRIPTION OF THE INVENTION

Similar to approaches employed in the semiconductor or MEMS industry, transducers can be produced using wafer-level processes to achieve fabrication and device consistency and cost reduction. A method of fabricating ultrasonic transducers, including the backing layer, using wafer-level processes, provides a potential for the highest device-to-device consistency and the lowest manufacturing cost. Accordingly, to overcome common issues with current high-frequency transducer backing layers and to significantly enhance transducer performance, consistency, and reliability, as well as lower the transducer manufacturing cost, a wafer-level method of fabricating a transducer is employed, including fabrication of a backing layer to significantly dampen the transducer response resulting in a high bandwidth transducer.

Figure 1:
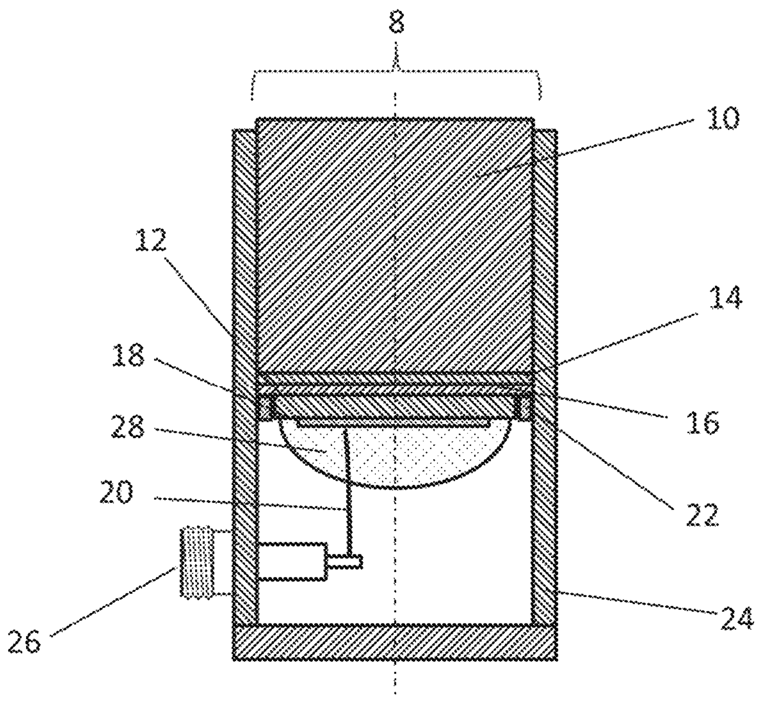
FIG. 1 Prior Art
FIG. 1 shows a schematic cross-sectional view of a conventional ultrasonic transducer with a delay line.
Figure 2A:
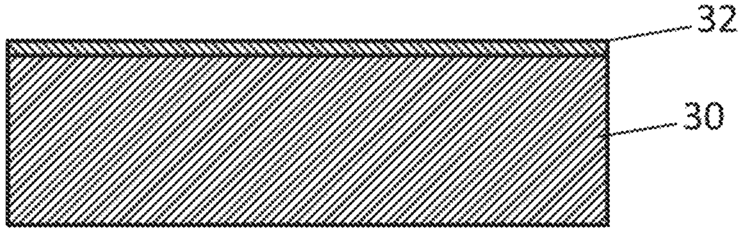
FIG. 2A shows a schematic cross-sectional view of a delay line substrate with a thin conductive metal layer, according to an embodiment.
Figure 2B:
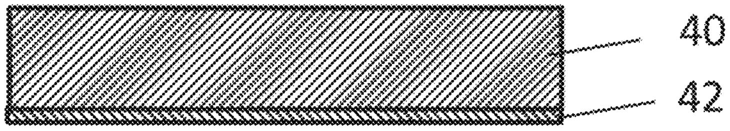
FIG. 2B shows a schematic cross-sectional view of a piezoelectric substrate with a thin conductive metal layer, according to an embodiment.

FIGS. 2A-2E illustrate basic fabrication steps of a wafer-level fabrication method for an ultrasonic delay-line transducer that enables reliable transducers to be manufactured with consistent device-to-device performance at a low manufacturing cost. In FIG. 2A, a delay line substrate 30 is fabricated from a suitable material. Also shown in FIG. 2A is a thin metal layer 32 vacuum deposited by conventional means, such as sputter deposition, on the delay line substrate 30. In FIG. 2B, an active transducer element in the form of a piezoelectric substrate 40 is shown. Also shown in FIG. 2B is a thin metal layer 42 deposited with the same material and thickness as the delay line substrate 30.

Once the thin metal layers 32, 42 are deposited on the respective substrates 30, 40, the two substrates may be pressed together to form an atomic diffusion bond. This type of bonding is extremely strong and robust and provides an efficient acoustic energy coupling between the two materials allowing the efficient transfer of ultrasonic waves in both directions. Alternatively, other wafer-level bonding techniques could be used such as polymer or adhesive, anodic, metal diffusion, thermo-compression, or eutectic-alloy bonding.

Figure 2C:
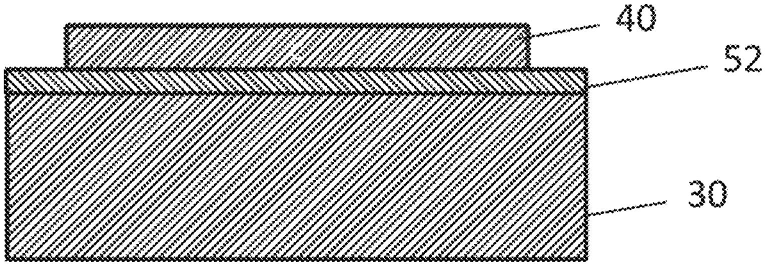
FIG. 2C shows a schematic cross-sectional view of the delay line substrate of FIG. 2A bonded with the piezoelectric substrate of FIG. 2B, according to an embodiment.

FIG. 2C shows the thin metal layer 32 of FIG. 2A bonded to the thin metal layer 42 of FIG. 2B to form a bonded metal layer 52 between the delay line substrate 30 and the piezoelectric substrate 40. If the thickness of the piezoelectric substrate 40 is greater than the thickness for the desired resonant frequency, then the piezoelectric substrate 40 may be thinned to the desired thickness. This thickness, t, may be approximated by the expression:

$$t = v_{sp}/2f_R \tag{1}$$

Where $v_{sp}$ is the velocity of sound in the piezoelectric substrate 40 and $f_R$ is the desired resonant frequency. It should be noted, that due to mass loading effects from the bonded delay line substrate 30 and deposition of the metal layers 32, 42, the required thickness, t, in practice, likely is lower than that calculated by Eq. (1) for the desired resonant frequency, $f_R$. Other advanced theoretical techniques and/or experimentation may be used to precisely determine the thickness necessary to obtain the desired resonant frequency.

After the thickness of the piezoelectric substrate 40 is attained, a portion 53 of the bonded metal layer 52 is exposed, in order to make an electrical connection and form one of two electrodes (see FIG. 2E) used to electrically-stimulate the piezoelectric substrate 40. While exposing the portion 53 of the bonded metal layer 52 may be achieved by a variety of conventional techniques such as that using an appropriate photomask combined with selective etching using reactive gases, ion milling, or a wet chemical etch, these techniques are difficult and expensive to employ with many desirable piezoelectric materials.

Figure 2D:
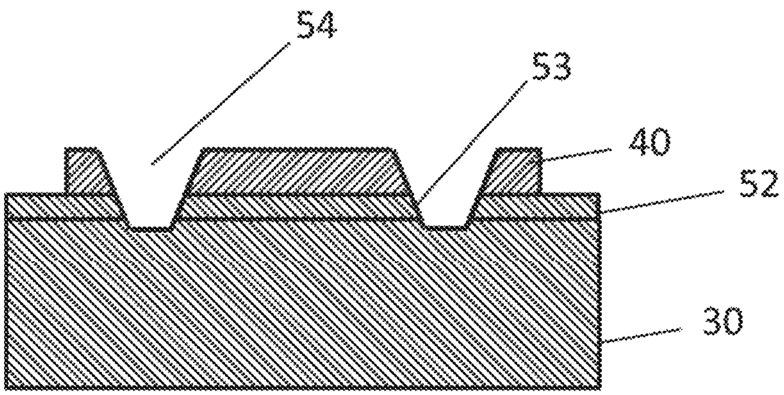
FIG. 2D shows a schematic cross-sectional view of the delay line substrate bonded with the piezoelectric substrate, as shown in FIG. 2C, having conductive metal layers exposed, according to an embodiment.

FIG. 2D shows the piezoelectric substrate 40 bonded to the delay line substrate 30 after the formation of a via 54. The via 54 is in the form of an annular ring with sloped sidewalls. U.S. patent application Ser. No. 16/204,249, entitled "ULTRASONIC TRANSDUCER AND METHOD OF FABRICATING AN ULTRASONIC TRANSDUCER", discloses a method for producing a via to allow external contact to a buried metal layer in an ultrasonic delay-line transducer, the method being consistent with reproducible performance at a low manufacturing cost across a wide variety of piezoelectric materials. This method can be used to form the via 54.

Figure 2E:
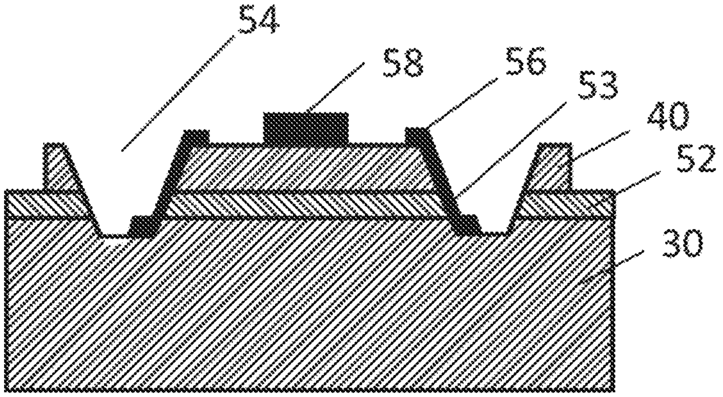
FIG. 2E shows a schematic cross-sectional view of the delay line substrate bonded with the piezoelectric substrate, as shown in FIG. 2D, having metal electrodes, according to an embodiment.

As shown in FIG. 2E, after the portion 53 at an edge of the bonded metal layer 52 is exposed, a first conductive layer 56, such as a metal, can be deposited by conventional means and patterned using a shadow mask. This first conductive layer 56 contacts the edge of the bonded metal layer 52 and extends onto the surface of the piezoelectric substrate 40. The first conductive layer 56, which forms a first electrode, can be patterned to allow external connection of the bonded metal layer 52 without interfering with a backing layer 58 that defines the active area of the device. The backing layer 58 can form a second electrode, providing a convenient way to apply an external voltage to the first and second electrodes to stimulate the piezoelectric substrate 40, which, if properly chosen and fabricated in accordance with this invention, can also act as a dampening layer resulting in a high bandwidth transducer.

Depending on the piezo material used, and the degree of damping desired, the backing layer 58 may be chosen to be a metal layer with appropriately high acoustic impedance. If the acoustic impedance of the piezoelectric substrate 40 is represented by $Z_p$, the acoustic impedance of the metal layer may usefully range between 0.1 $Z_p$ and 5 $Z_p$. In addition, the metal layer is deposited in such a way that its morphology results in the scattering, diffusion, or absorption of the backward traveling acoustic wave. One possible way of achieving both the degree of damping desired and to scatter, diffuse, or absorb the backward traveling acoustic wave is to deposit a metal film with a substantially columnar cross-sectional morphology and/or granular surface morphology. Properly done, this metal film morphology creates high acoustic losses allowing the film to function as a proper backing layer to both dampen, via a close impedance match with the piezo material, and attenuate via scattering, diffusing, and otherwise absorbing the backward traveling wave. In order for the metal film to adequately scatter, diffuse, or otherwise absorb the backward traveling wave, the grain size and width of the columns in the metal film can range between 0.1λ and 10λ where the wavelength, λ, of sound waves in the metal film as given by Eq. (2):

$$\lambda = v_{sm}/f_R \quad (2)$$

where $v_{sm}$ is the sound velocity in the backing layer 57 and $f_R$, is the resonant frequency of the piezoelectric element as described in accordance with Eq. (1). It should be noted that for most applications, such as in the electronic or optical industries, this type of film morphology is highly undesirable and is actively avoided because in these applications, a dense, uniform, smooth film is desired. While the film morphology taught in this invention is anomalous for most common applications, the film morphology may be produced using conventional film deposition methods, but under particular or unconventional conditions. A specific example is given for, but not limited to, a metallic tin film deposited by RF sputtering. In this particular example, tin provides a high acoustic impedance (equal to approximately $24\times10^6$ rayl) backing layer when coupled with a lithium niobate piezoelectric element (with an acoustic impedance of approximately $32.5\times10^6$ rayl). In this example, the acoustic impedance of the metal layer is approximately $0.74Z_p$. It is recognized that other metal layers combined with other piezoelectric materials may be used. Some example metal film materials include, but are not limited to, aluminum, gold, silver, titanium, zinc, nickel, indium, chromium, platinum, palladium, and copper. In addition, it is recognized that metal alloys made from combinations of the aforementioned metal materials may be used. These materials, acting as backing layers, may be combined with other piezoelectric materials such as, but not limited to, lithium tantalate, lithium iodate, zinc oxide (ZnO), aluminum nitride (AlN), lead zirconate titanate (PZT), barium titanate, lead metaniobate or quartz.

Figure 3A:
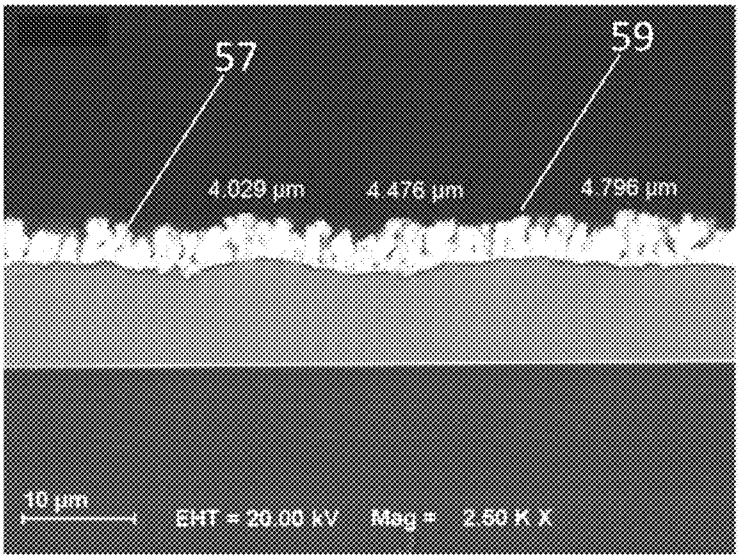
FIG. 3A shows a SEM cross sectional view of a metallic tin layer formed in accordance with an embodiment of the invention.
Figure 3B:
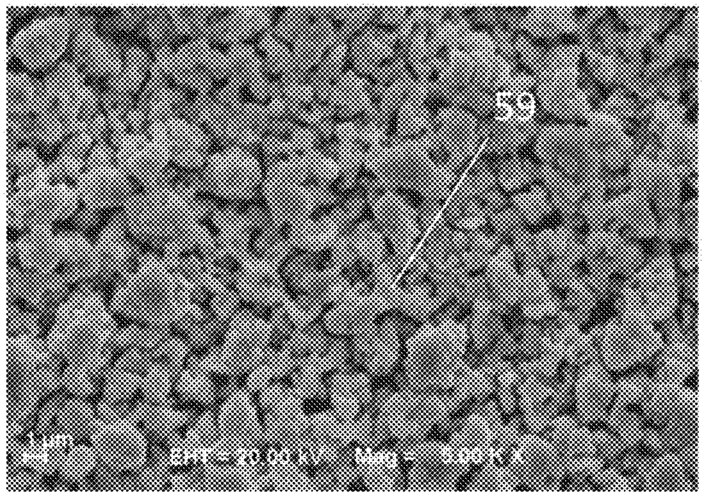
FIG. 3B shows a SEM top view of a metallic tin layer formed in accordance with an embodiment of the invention.

FIG. 3A is an SEM cross section showing an example of such a layer 57, using tin, and deposited by RF sputtering with a morphology that is substantially columnar. A surface 59 of the layer 57 appears rough and granular, which can be seen more clearly in FIG. 3 showing a SEM image of the top surface 59. The average film thickness in this example is approximately $4.5\times10^{-6}$ meters. As can be seen in the images, the metallic tin column widths (FIG. 3A) and the grain sizes (FIG. 3B) vary from approximately $0.5\times10^{-6}$ meters to $3\times10^{-6}$ meters. Given these dimensions and utilizing Eq. (2) with a sound velocity, $v_{sm}$, in the tin metal film of 3300 meters per second, such a film provides varying degrees of scattering, diffusion, and otherwise absorption of the backward traveling wave of frequencies less than approximately $1\times10^9$ hertz. This metal film provides a useful backing layer for a broad frequency range of high frequency transducers.

It is beneficial for this thickness of the backing layer 57 to be thick enough such that the backward traveling wave is sufficiently attenuated by the propagation distance achieved after the backward traveling wave has traveled to and reflected from the surface 59 of the layer. The required thickness for this backing layer 57 depends on the amount of acoustic loss experienced by the backward traveling wave propagating in the backing layer 57. For example, at frequencies above $100\times10^6$ hertz, attenuation levels in the backing layer 57 of 10 to 60 decibel per centimeter per $10^6$ hertz require approximate thicknesses in the range of $300\times10^{-6}$ meter to $30\times10^{-6}$ meter, respectively. If these thicknesses are not obtainable in practical terms then the thickness should be made to be approximately ¼ λ, wherein λ refers to the wavelength of sound waves within the backing layer as given by Eq. (2). This chosen thickness results in the much-attenuated backward traveling wave that is reflected from the surface 59 of the layer 57 to have a total round trip phase shift of approximately ½ λ, resulting in the wave destructively adding to the frontward traveling wave causing the least amount of distortion of the waveform at the expense of a slightly longer pulse duration and slightly lower bandwidth. In actual practice, the thickness varies from this ¼ λ value because of differences in sound velocity in the backing layer partially due to non-uniform morphology of the backing layer. In addition, mass loading and other effects are likely to require the piezo element to be thinner than that obtained based on the ideal free resonant frequency of the piezoelectric element. The thickness of the backing layer may usefully range between 3/16 λ and 5/16 Δ. It is recognized that optimization of the thicknesses of both the piezoelectric and metal backing layers are needed in order to achieve the desired resonant frequency with the least amount of waveform distortion.

Figure 4A:
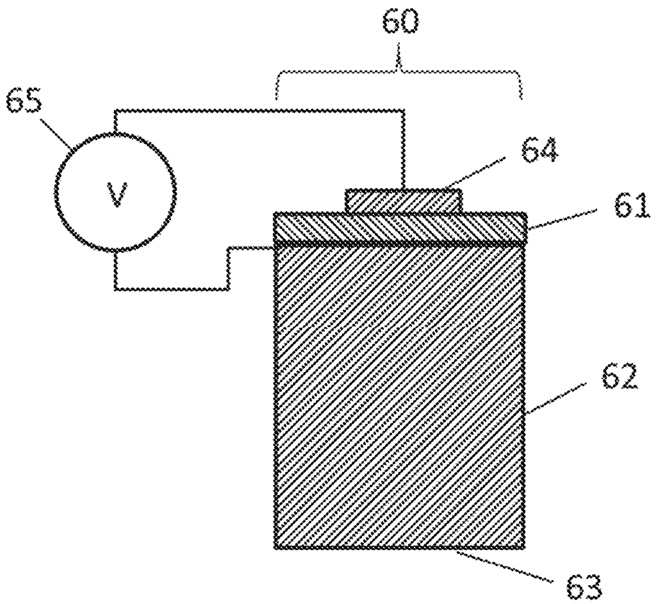
FIG. 4A shows a schematic cross-sectional view of a delay line transducer simulated using the KLM model, according to an embodiment.
Figure 4B:
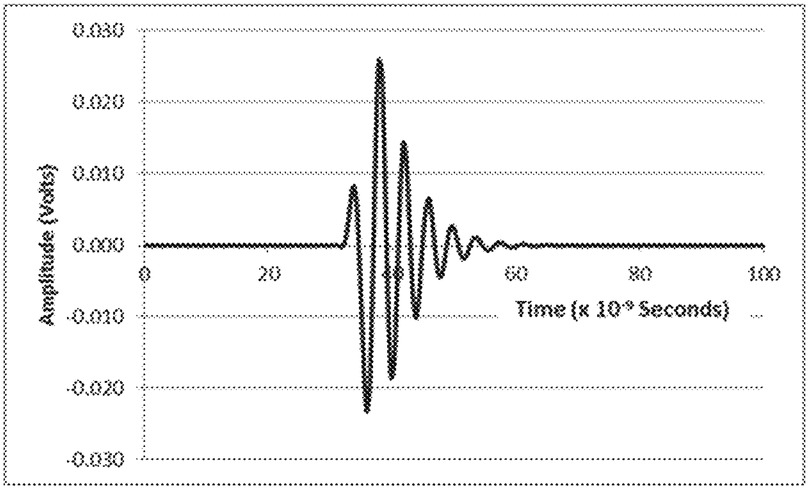
FIG. 4B shows the waveform obtained from a delay line transducer simulation with a backing layer comprised of a thin layer of gold, according to an embodiment.
Figure 4C:
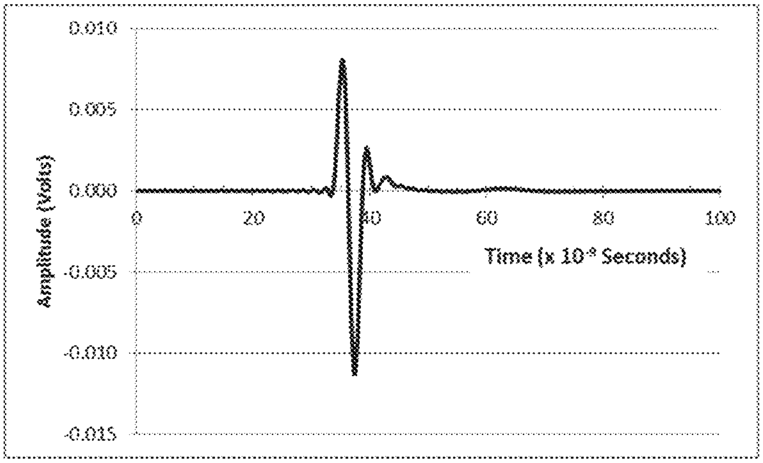
FIG. 4C shows the waveform obtained from a delay line transducer simulation with a backing layer comprised of a thick layer of high acoustic loss tin, according to an embodiment.

An illustration of this concept can be obtained from simulations using the commonly employed Krimholtz, Leedom, and Matthaei (KLM) model. FIG. 4 illustrates one particular example of a delay line transducer 60, wherein an $18\times10^{-6}$ meter thick lithium niobate piezoelectric element 61 is coupled to a $7.5\times10^{-3}$ meter thick fused silica delay line 62 on one side while the other side is first coupled to a relatively thin (compared to the acoustic wavelength) $5.0\times10^{-7}$ meter thick gold backing layer 64. In accordance with Eq. (1), with a sound velocity, $v_{sp}$, in the lithium niobate piezoelectric substrate of approximately 7300 meters per second, the resonant frequency, $f_R$, is approximately $2.0\times10^8$ hertz. As noted previously, in practice, the measured resonant frequency will likely be lower due to mass loading effects from the delay line substrate and metal layers. In this first case, the gold backing layer 64 is assumed to be typical and have a very low acoustic loss (less than 1 decibel per centimeter per $10^6$ hertz). A Gaussian voltage pulse generator 65 with an amplitude of 100 volts and an approximate $1.5\times10^{-9}$ second rise and $2.0\times10^{-9}$ second fall is applied to either side of the piezoelectric element 61. FIG. 4B shows a simulated pulse after reflecting from the front surface 63 of the delay line 62. This reflected pulse is referred to as a delay line echo. As can be seen from FIG. 4B, the delay line echo continues for several cycles, which is indicative of a relatively poorly damped transducer. When the gold backing layer 64 is replaced by a relatively thick ($4.0\times10^{-5}$ meter), high acoustic loss (55 decibel per centimeter per $10^6$ hertz) tin backing layer 64, then the delay line echo is substantially better damped, oscillating for only slightly more than one cycle, as illustrated in FIG. 4C. This tin thickness is chosen, based on the acoustic loss, and sound velocity of the tin, such that the backward traveling wave generated from the piezoelectric element 61 coupled into the thick tin backing layer 64 is sufficiently attenuated and negligible in amplitude upon its return after being reflected from the top-most surface of the tin backing layer 64. The resulting highly damped device performance is directly due to both the high acoustic impedance as well as high acoustic loss behavior of the tin layer. However, while this thick tin layer is ideal for highly damped performance, such a layer may not be practical given the thickness of the thick tin layer, as the thickness may require long deposition times that may result in a high manufacturing cost.

Figure 4D:
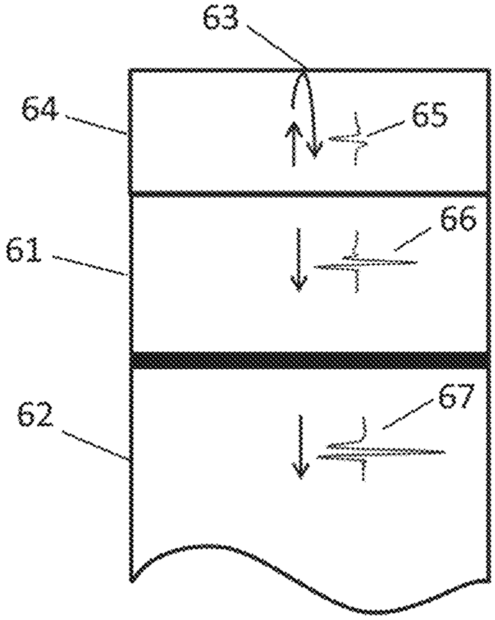
FIG. 4D shows a schematic cross-sectional view of a delay line transducer simulated using a KLM model illustrating the propagating waveforms broken down into forward traveling, backward traveling, and composite waveforms, according to an embodiment.
Figure 4E:
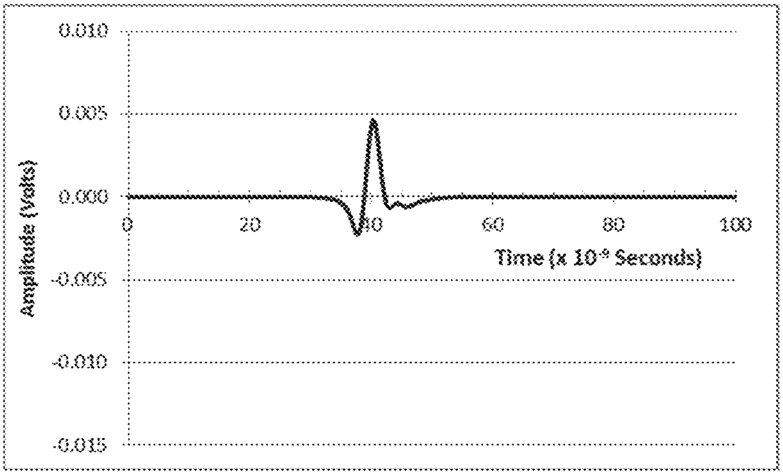
FIG. 4E shows a backward traveling waveform obtained from a delay line transducer simulation with a backing layer comprised of a thin layer of high acoustic loss tin, according to an embodiment.
Figure 4F:
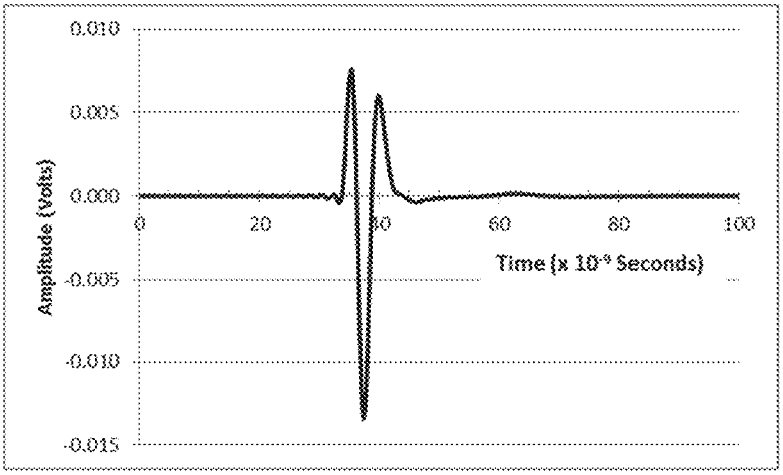
FIG. 4F shows the composite waveform obtained from a delay line transducer simulation with a backing layer comprised of a thin layer of high acoustic loss tin, according to an embodiment.

A more practical alternative is to deposit a thinner layer of tin. FIG. 4D shows a schematic cross-sectional view of the delay line transducer 60, further illustrating the propagating waveforms broken down into forward traveling, backward traveling, and composite waveforms, wherein the backing layer 64 includes a thinner layer of tin. For this situation, referring to FIG. 4D, it is instructive to consider both the forward traveling wave 66 and the backward traveling wave 65 generated from the piezo element 61. It can be assumed that the forward traveling wave 66 is similar in properties to the waveform obtained in the aforementioned case of the thicker backing layer 64. However, for this latter case, it is beneficial to choose the thickness of the backing layer 64 based on the sound velocity of the tin, such that the backward traveling wave 65 that couples into this thinner tin backing layer 64 and is reflected from a top surface 63 of the tin backing layer 64, is delayed by one half cycle relative to the forward traveling wave 66. For this particular example, choosing a tin layer thickness in accordance with Eq. (2) yields a ¼ λ thickness value for the tin backing layer of approximately $4.0\times10^{-6}$ meter. The resulting reflected backward traveling wave 65 is illustrated in FIG. 4E. Note that the reflected backward traveling wave 65, as compared to the forward traveling wave 66, is reduced in amplitude as well as reduced in frequency, due to the frequency dependent acoustic loss assumed in the backing layer 64. The reflected backward traveling wave 65 is also inverted as expected, as the acoustic impedance is lower on the top surface 63 of this tin backing layer 64 as the tin backing layer 64 is assumed to be surrounded by air. It is imperative that this tin backing layer 64 be of high enough acoustic loss such that subsequent reflections from the tin backing layer 64 are negligible in amplitude. The resulting net waveform 67 that couples into the delay line 62 can be approximated as the superposition of the reflected backward traveling wave 65 and the forward traveling wave 66. This superposition, obtained by adding the aforementioned waveforms, is shown in FIG. 4F. While the delay line echo waveform shown in FIG. 4F corresponding to the thinner tin is not as well damped as the waveform shown in FIG. 4C corresponding to the thicker tin, it is noted that the delay line echo waveform in FIG. 4F still represents a substantially damped device, especially as compared to the waveform shown in FIG. 4B corresponding to the thin gold layer, and would be extremely useful in typical applications for well damped, short temporal response transducers.

Figure 5:
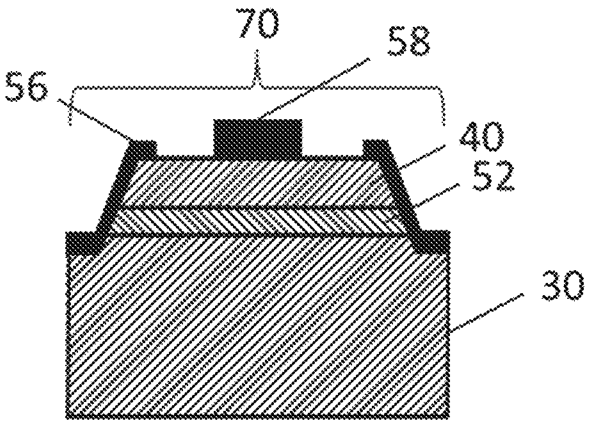
FIG. 5 shows a schematic cross-sectional view of an individual delay line transducer fabricated according to the steps shown in FIG. 2A-FIG. 2E.

Lastly, continuing the steps shown in FIG. 2A through 2E, to complete the fabrication, an individual delay line transducer 70, as shown in FIG. 5, may be obtained by using conventional core-drilling techniques applied to the substrates. The individual delay line transducer 70 may be mounted in an appropriate encasement and an external connection of the first conductive layer 56 and the conductive backing layer 58 can be made with any number of conventional means. A proper stimulus voltage, typically in the form of a pulse, may be applied to the two electrodes 56, 58 producing an ultrasonic wave that propagates from the piezoelectric substrate 40 into the delay line substrate 30 and may be used to interrogate a given test material that is coupled to the delay line substrate 30. After an appropriate delay time, a reflected wave from the interrogated test material propagates back to the piezoelectric substrate 40 and can be measured with appropriate receiver electronics.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. An ultrasonic transducer comprising:
a delay line substrate;
a piezoelectric element;
a metal conductive layer between the delay line substrate and the piezoelectric element; and
a backing layer applied to the piezoelectric element,
the delay line substrate and the piezoelectric element being acoustically joined, configured to couple ultrasonic waves from the piezoelectric element into the delay line substrate or from the delay line substrate into the piezoelectric element,
the backing layer including a metal film, the metal film having a thickness and an acoustic impedance, the thickness and the acoustic impedance each of sufficient value to provide acoustic damping, the backing layer having a columnar cross-sectional morphology with a granular surface morphology, wherein the thickness of the backing layer is equal to 3/16 to 5/16 of a wavelength of sound waves within the backing layer at a free resonant frequency of the piezoelectric element.

2. The ultrasonic transducer of claim 1 wherein the delay line substrate includes at least one of glass, ceramic, crystalline, and plastic material.

3. The ultrasonic transducer of claim 1, where the delay line substrate includes glass that contains silicon or fluorine.

4. The ultrasonic transducer of claim 1, wherein the delay line substrate includes at least one of fused silica, fused quartz, and single crystal silicon.

5. The ultrasonic transducer of claim 1, wherein the piezoelectric element includes piezoelectric crystalline or ceramic material.

6. The ultrasonic transducer of claim 1, wherein the piezoelectric element includes at least one of LiNbO3, LiIO3, PZT, BaTiO3, ZnO, AlN, and Quartz.

7. The ultrasonic transducer of claim 1, wherein the metal conductive layer includes at least one of Cu, Al, Ti, Ta, Au, Ag, Ni, Fe, and Pt.

8. The ultrasonic transducer of claim 1, wherein an acoustic loss of the backing layer is between 10 to 60 decibel per centimeter per $10^6$ hertz and a thickness of the backing layer in a range of $300\times10^{-6}$ meter to $30\times10^{-6}$ meter, respectively.

9. The ultrasonic transducer of claim 1, wherein the columnar cross-sectional morphology with the granular surface morphology of the backing layer has grain sizes in a range of 1/10 to 10 times an acoustic wavelength of an ultrasonic wave in the metal backing layer during operation of the ultrasonic transducer.

10. The ultrasonic transducer of claim 1, wherein the thickness of the backing layer produces a round trip phase shift of a backward traveling wave of 3/8 to 5/8 of a cycle relative to the frontward traveling wave resulting in the backward traveling wave destructively adding to the frontward traveling wave.

11. The ultrasonic transducer of claim 1, wherein the metal film includes at least one of aluminum, tin, gold, silver, titanium, zinc, nickel, indium, chromium, platinum, palladium, and copper.

12. The ultrasonic transducer of claim 1, wherein the metal film has an acoustic impedance in a range of 1/10 to five times the acoustic impedance of the piezoelectric element.

13. A method of producing an ultrasonic transducer, the method comprising the steps of:

providing a delay line substrate;

providing a piezoelectric substrate as an active transducer element;

depositing a first metal layer on the delay line substrate;

depositing a second metal layer on the piezoelectric substrate;

bonding the first metal layer to the second metal layer to facilitate coupling ultrasonic waves from the piezoelectric element into the delay line or from the delay line into the piezoelectric element;

exposing a portion of at least one of the first metal layer and the second metal layer;

depositing a first patterned electrode on the portion to allow external electrical connection to the at least one of the first metal layer and the second metal layer;

depositing a second patterned electrode on the piezoelectric element, the second patterned electrode defining an active area of the ultrasonic transducer and acting as a backing layer, the second patterned electrode configured to electrically connect externally and including a metal film, the metal film having an acoustic impedance and a thickness, the acoustic impedance and the thickness being of sufficient value to provide acoustic damping, the thickness of the metal film being equal to 3/16 to 5/16 of a wavelength of sound waves within the backing layer at a free resonant frequency of the piezoelectric element, the metal film having a columnar cross-sectional morphology with a granular surface morphology.

14. The method of claim 13, wherein exposing a portion of at least one of the first metal layer and the second metal layer includes milling the piezoelectric substrate.

15. The method of claim 14, wherein the substantially columnar cross-sectional morphology with the substantially granular surface morphology of the metal film has grain sizes in the range of 1/10 to 10 times the acoustic wavelength of the ultrasonic wave in the metal backing layer.

* * * * *